(12) United States Patent
Lin et al.

(10) Patent No.: US 9,077,168 B2
(45) Date of Patent: Jul. 7, 2015

(54) DIFFERENTIAL MODE SIGNAL TRANSMISSION MODULE

(71) Applicant: ADVANCED FLEXIBLE CIRCUITS CO., LTD., Taoyuan County (TW)

(72) Inventors: Gwun-Jin Lin, Taoyuan County (TW); Kuo-Fu Su, Taoyuan County (TW)

(73) Assignee: Advanced Flexible Circuits Co., Ltd., Taoyuan County (TW)

( * ) Notice: Subject to any disclaimer, the term of this patent is extended or adjusted under 35 U.S.C. 154(b) by 217 days.

(21) Appl. No.: 13/690,344

(22) Filed: Nov. 30, 2012

(65) Prior Publication Data

US 2014/0014409 A1    Jan. 16, 2014

(30) Foreign Application Priority Data

Jul. 11, 2012   (TW) .............................. 101124914 A

(51) Int. Cl.
*H01B 7/08* (2006.01)
*H02G 15/08* (2006.01)
(Continued)

(52) U.S. Cl.
CPC ............. *H02G 15/08* (2013.01); *H05K 1/0219* (2013.01); *H05K 1/0225* (2013.01); *H05K 1/0245* (2013.01); *H05K 1/0253* (2013.01); *H05K 1/117* (2013.01); *H05K 1/118* (2013.01);
(Continued)

(58) Field of Classification Search
CPC ....... H02G 15/08; H05K 1/0215; H05K 1/11; H05K 2201/10356
USPC .................. 174/254, 257, 261, 117 F, 117 FF; 257/730, 712
See application file for complete search history.

(56) References Cited

U.S. PATENT DOCUMENTS 5,083,238 A * 1/1992 Bousman ....................... 361/788
6,885,549 B2 * 4/2005 Thomason ............... 361/679.27
(Continued)

FOREIGN PATENT DOCUMENTS

CN    201185099 Y    1/2009
TW       476229 B    2/2002
(Continued)

OTHER PUBLICATIONS

Communication From the Taiwan Patent Office Regarding a Counterpart Foreign Application Dated (Taiwan Year 103) Jun. 23, 2014.

*Primary Examiner* — Yuriy Semenenko

(74) *Attorney, Agent, or Firm* — Rosenberg, Klein & Lee

(57) ABSTRACT

A differential mode signal transmission module includes a first section having an external connection end on which at least a pair of differential mode signal transmission terminals are formed and includes a grounding terminal, a first differential mode signal terminal, and a second differential mode signal terminal. The extension connection end of the first section forms a counterpart signal terminals corresponding to those of the external connection end. At least one first conductive connection line is formed on the first section. The conductive connection line connects the grounding terminal of the external connection end of the first section to a collective grounding point. The extension connection end of the first section is connected to an extension section. The extension section is further connected to a second section opposite to the first section. The extension section includes at least one slit line in order to form a bundled section. The first section, the second section, and the extension section include at least one fold line.

21 Claims, 13 Drawing Sheets

(51) Int. Cl.
   *H05K 1/02* (2006.01)
   *H05K 1/11* (2006.01)
   *H05K 1/14* (2006.01)

(52) U.S. Cl.
   CPC ....... *H05K 1/147* (2013.01); *H05K 2201/0715* (2013.01); *H05K 2201/09063* (2013.01); *H05K 2201/09254* (2013.01)

(56) References Cited

U.S. PATENT DOCUMENTS

| | | | |
|---|---|---|---|
| 7,180,001 | B1 | 2/2007 | Lin et al. |
| 8,427,380 | B2 * | 4/2013 | Farrell et al. .................. 343/705 |
| 8,698,044 | B2 * | 4/2014 | Burr et al. ..................... 219/211 |
| 2003/0146018 | A1 * | 8/2003 | Sinkunas et al. .............. 174/254 |
| 2006/0042820 | A1 * | 3/2006 | Lin et al. ..................... 174/117 F |
| 2007/0054519 | A1 * | 3/2007 | Lin et al. ...................... 439/101 |
| 2008/0196757 | A1 * | 8/2008 | Yoshimine .................... 136/244 |
| 2011/0094775 | A1 | 4/2011 | Lin et al. |
| 2011/0121922 | A1 * | 5/2011 | Blair et al. .................... 333/238 |
| 2011/0189508 | A1 * | 8/2011 | Inoue et al. ....................... 429/7 |
| 2012/0120607 | A1 * | 5/2012 | Millard et al. ................ 361/704 |

FOREIGN PATENT DOCUMENTS

| | | |
|---|---|---|
| TW | I289372 B | 11/2007 |
| TW | M341322 U | 9/2008 |
| TW | M379203 U | 4/2010 |
| TW | 201115596 A1 | 5/2011 |
| WO | WO2007136040 * | 11/2007 |

\* cited by examiner

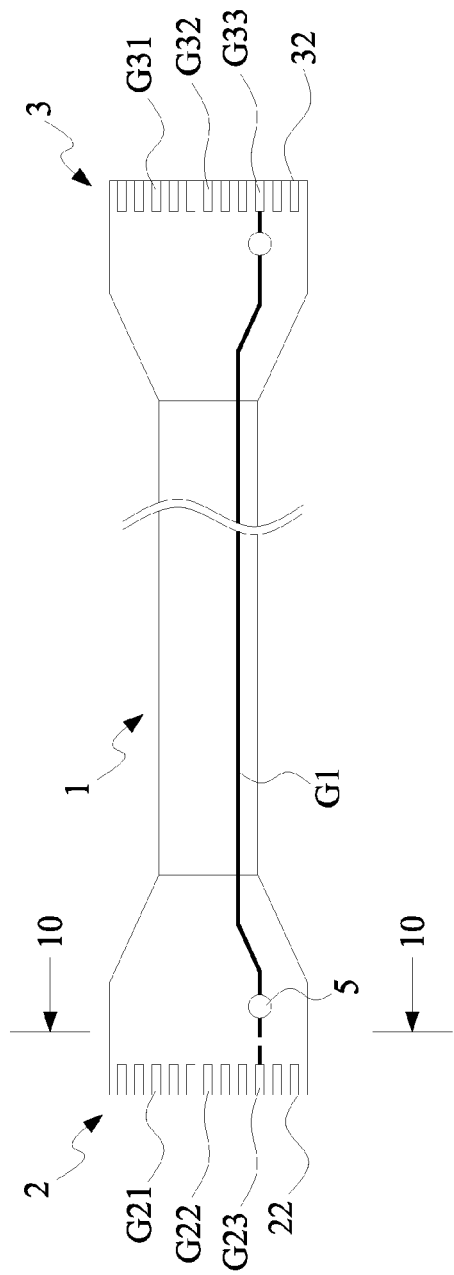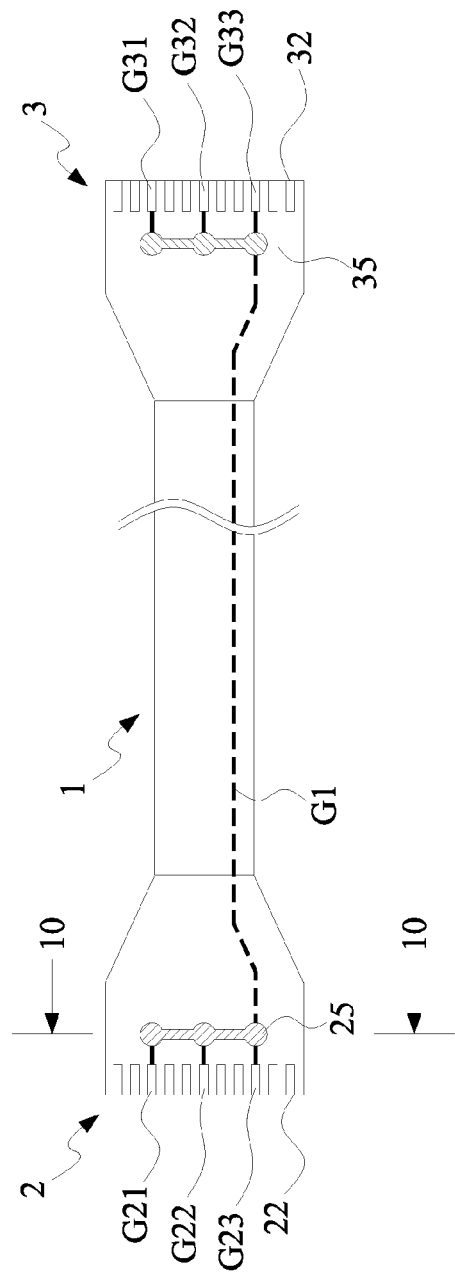

DIFFERENTIAL MODE SIGNAL TRANSMISSION MODULE

BACKGROUND OF THE INVENTION

1. Field of the Invention

The present invention relates to a signal transmission circuit cable, and in particular to a differential mode signal transmission module for transmitting differential mode signals.

2. The Related Arts

General processes for manufacturing flexible circuit boards can be classified as (1) a flexible board formed by transferring image to and etching a conductor layer and laminating an insulation layer, (2) a flexible board formed by directly printing a conductor layer on an insulation substrate, and (3) a standard flexible circuit cable formed by stretching a plurality of straight and parallel conductor wires by a coiling machine and laminating an insulation layer. Classification made according to functionality may include carrier boards, flat cables, and flexible printed circuit board featuring functions of both carrier board and flat cable. The flexible circuit boards bear numerous different names, such as flexible printed circuit boards and flexible flat cables, and they all refer to the same product.

A flexible circuit cable easily generates electromagnetic waves of high frequency and high energy in transmitting signals. Thus, the signal transmitted is also susceptible to interference by external high frequency noises and signal distortion may result. Further, a flexible flat cable or a circuit board often generates high voltage electrostatic discharge due to extension through a bore in movement and fast and effective grounding connection is of vital importance in this situation.

To cope with such a problem, a known solution is to cover a metal shielding layer on a surface of a flexible circuit board to block the external electromagnetic noises. Although such a metal shielding layer is effective in suppress the interference caused by the external electromagnetic noises, yet the covering metal shielding layer is not actually connected the ground of an electronic device, so that the effect of the metal shielding layer for shielding electromagnetic noises and eliminating electrostatic discharge is generally poor.

Thus, the existing electronic devices commonly use the conventional flexible circuit boards that are made through etching processes and are easily connectable to ground for signal connection. However, the conventional flexible circuit boards are of costs that are much higher than the flexible circuit cables. Further, the reason that the flexible circuit cables do not provide an effect of electromagnetic noise shielding is that the manufacture thereof is done by stretching conductor wires followed by laminating, and thus, the conductor wires cannot be made thin, which makes control of impedance difficult. Thus, it is now an immediate challenge for the industry to reduce cost by using flexible circuit cable to partly replace the use area of the conventional flexible circuit board and to also provide a conduction structure that eliminates electrostatic discharge. In addition, applications of some of these products require extension through a narrow hole or a hinge bore and bending resistance test for being bent tens of thousands times. Partial slitting to form a bundled structure is also inevitable.

Further, in the various modern electronic devices, the amount of data transmitted through signal lines is increasingly expanded. Thus, the number of signal transmission lines used is increased and the frequency of the transmission signal is also getting higher. Consequently, a differential mode is often used in high frequency transmission to reduce electromagnetic interference (EMI). For example, USB or LVDS signals are commonly transmitted with such a technique to reduce EMI. Referring to FIG. 1, a schematic view is given to illustrate a conventional flexible circuit cable transmitting a differential mode signal. The differential mode signal transmitted by a flexible circuit cable A includes a plurality of differential mode signal transmission terminals S. Each of the differential mode signal transmission terminals S is composed of a first differential mode signal conductor wire Sa, a second differential mode signal conductor wire Sb, and a grounding conductor wire Ga. The first differential mode signal conductor wire Sa and the second differential mode signal conductor wire Sb form two-paired wires, called a differential pair, capable of transmitting two complementary signals that have identical levels but opposite phases. The technique of differential mode signal transmission improves resistance to electromagnetic noise. Since two conductor wires are placed very close and the amplitudes of the signals are identical and since the amplitudes of the coupling electromagnetic fields with respect to grounding lines are also identical, with the phases of the two conductor wires being opposite, the electromagnetic fields thereof will cancel each other and thus the influence thereof by external electromagnetic interference is reduced.

However, when a flexible circuit cable is used to transmit a differential mode signal, the number of the conductor wires thereof is the summed number of the plurality of differential mode signal transmission terminals S, plus at least one power line P and a primary grounding line Gp. If the differential mode signal transmission terminals S are of a relatively large number, the total number of the conductor wires of the flexible circuit cable is increased and will occupy a large amount of space of a circuit in a practical application. If the flexible circuit cable must be set through a hinge or a narrow hole, the excessive number of the conductor wires makes it difficult to smoothly extend through the bore of a hinge member or a narrow hole. Further, the increase of the number of the conductor wires may lead to shortcomings, such as increased manufacturing cost, increased weight, and expansion of wire volume of the electronic device.

SUMMARY OF THE INVENTION

To effectively overcome the previous shortcomings, an object of the present invention is to provide a differential mode signal transmission module, which comprises a first section having an external connection end on which differential mode signal transmission terminals (including standard grounding terminal, a first differential mode signal terminal, and a second differential mode signal terminal) corresponding to an electronic device are formed and an extension connection end on which a counterpart first differential mode signal and a counterpart second differential mode signal terminal corresponding to the external connection end are formed and comprises no grounding terminal or a reduced number of grounding terminal.

Another object of the present invention is to provide a differential mode signal transmission module having a reduced number of conductor wires, which comprises a first section that is extended from and connected to an extension section via soldering, a connector, or being integrally formed therewith. The extension section is further connected to a second section. The external connection ends of the first and second sections both form differential mode signal transmission terminals corresponding to electronic device. The extension section forms a counterpart first differential mode signal and a counterpart second differential mode signal terminal corresponding to the external connection ends and comprises no grounding terminal or a reduced number of grounding terminal A further object of the present invention is to provide a circuit board module having a wider application, wherein circuit boards used can be rigid circuit boards, flexible circuit boards, or rigid-flexible boards. When a flexible circuit board is used, to facilitate extension through a narrow hole or a bore of a hinge, a plurality of slit lines is formed by cutting along gaps between signal lines for forming a folded or bundled structure so that in a practical application, easy extension of the flexible circuit cable through a narrow hole or a bore of a hinge can be made and electrical connection can be made to each grounding terminal through a conductive connection line so as to reduce the number of conductor wires included in the flexible circuit cable and the reduce the weight.

To achieve the above objects, the present invention provides a differential mode signal transmission module, which comprises a first section, which comprises an external connection end and an extension connection end, wherein the external connection end forms at least a pair of differential mode signal transmission terminals. The differential mode signal transmission terminals comprise a grounding terminal, a first differential mode signal terminal, a second differential mode signal terminal. The extension connection end forms a counterpart first differential mode signal terminal corresponding to the first differential mode signal terminal of the external connection end and a counterpart second differential mode signal terminal corresponding to the second differential mode signal terminal of the external connection end. At least one first conductive connection line is formed on the first section. The conductive connection line connects the grounding terminal of the external connection end of the first section to a collective grounding point. The collective grounding point is formed at the extension connection end of the first section or is grounded through a primary grounding terminal or an electronic device. The first section has an upper surface and a lower surface one of which comprises a shielding layer and a net-like holed structure for impedance control of the differential mode signals.

The extension connection end of the first section is connected to an extension section by one of soldering and a connector. The extension section is further connected to a second section opposite to the first section. In another embodiment of the present invention, the extension connection end of the first section is integrally extended from and connected to an extension connection end of a second section via an extension section.

Preferably, the extension section comprises at least one slit line extending in an extension direction in order to form a bundled section to facilitate extension through a bore of a hinge member or a narrow. The bundled section comprises a wrapping member wrapping around the bundled section. Further, the first section, the second section, and the extension section comprise at least one fold line to allow the first section, the second section, and the extension section to fold along the fold line.

Thus, the number of conductor wires used in the extension section only needs to include the differential mode signal conductor wires so as to effectively reduce the number of conductor wires and size of the extension section thereby overcoming the difficult that extension through a bore of a hinge member or a narrow is impossible due to an excessive number of conductor wires used. Further, the manufacturing cost of electronic devices can be lowered down and the weight of the electronic devices is reduced.

BRIEF DESCRIPTION OF THE DRAWINGS

The present invention will be apparent to those skilled in the art by reading the following description of preferred embodiments of the present invention, with reference to the attached drawings, in which:

FIG. 8 is a top plan view showing a second embodiment of the present invention;

FIG. 9 is a schematic view showing a back side of the second embodiment of the present invention;

DETAILED DESCRIPTION OF THE PREFERRED EMBODIMENTS

Figure 1:
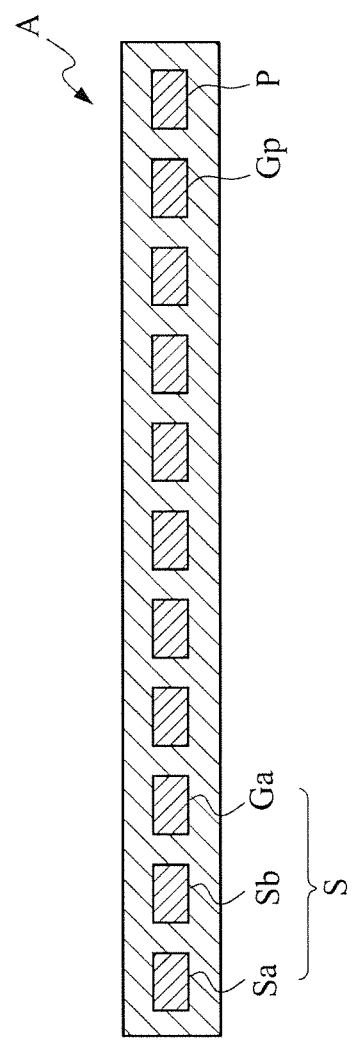
FIG. 1 is a schematic view showing a conventional flexible circuit cable transmitting a differential mode signal.
Figure 2:
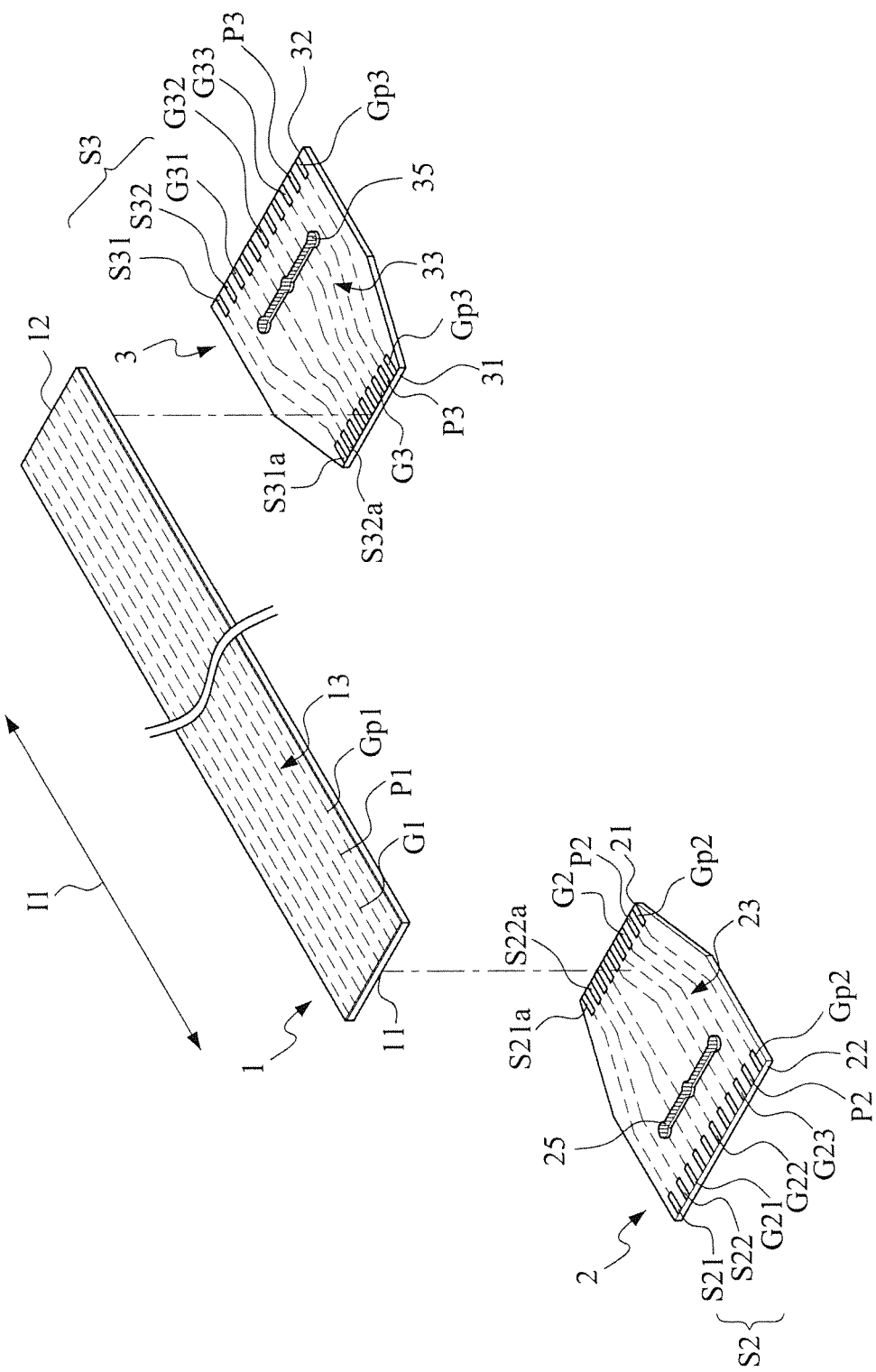
FIG. 2 is a schematic view showing an extension section of a first embodiment of the present invention separate from a first section and a second section.
Figure 3:
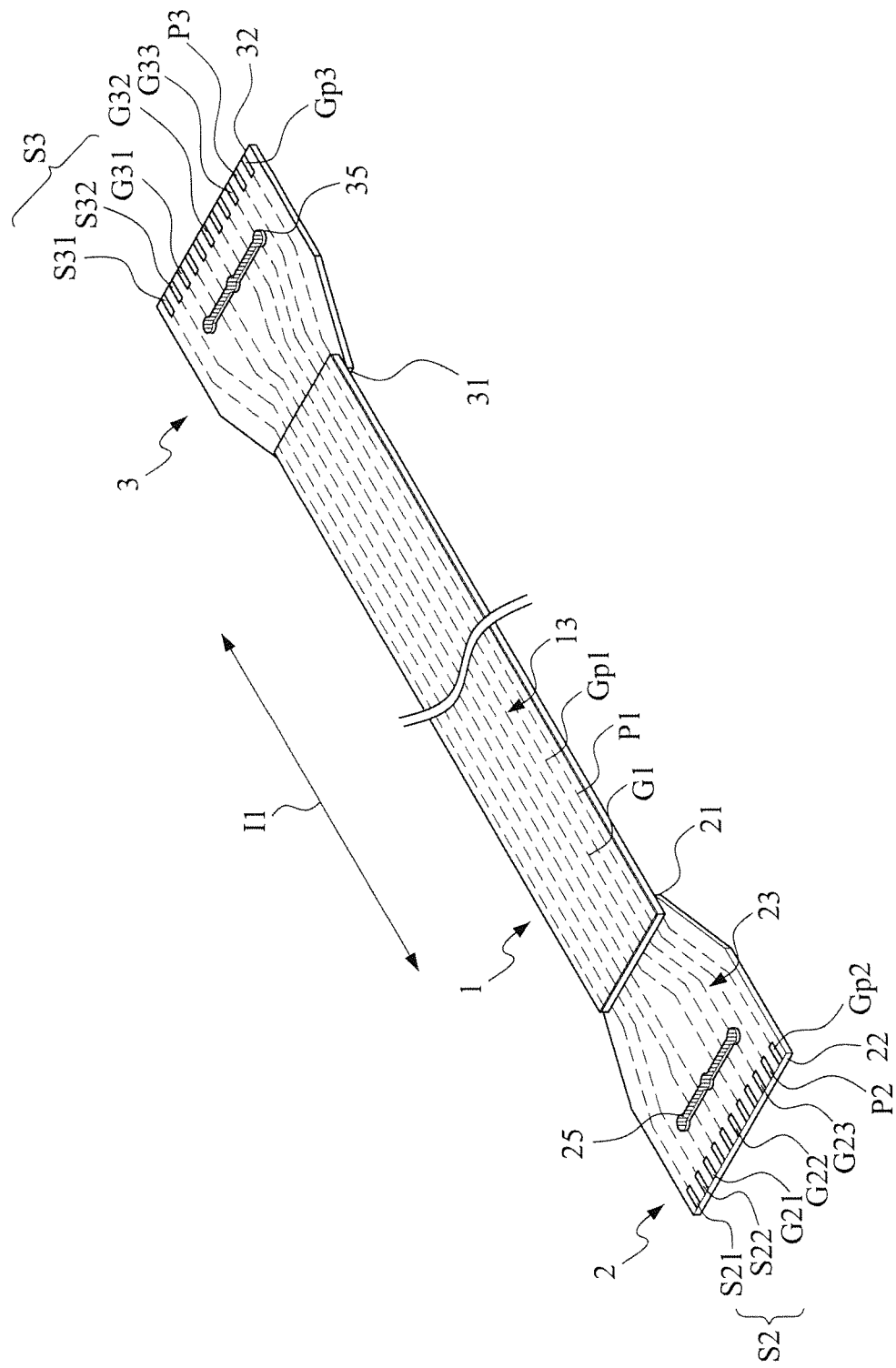
FIG. 3 is a schematic view showing the extension section of the first embodiment of the present invention coupled to the first section and the second section.

With reference to the drawings and in particular to FIGS. 2 and 3, FIG. 2 is a schematic view showing an extension section of a first embodiment of the present invention separated from a first section and a second section and FIG. 3 is a schematic view showing the extension section of the first embodiment of the present invention coupled to the first section and the second section. As shown in the drawings, the present invention provides a differential mode signal transmission module, which comprises an extension section 1, a first section 2, and a second section 3.

The extension section 1 has a first end 11 and a second end 12 and further comprises a plurality of parallel and straight conductor wires 13 that is not jump-connected and extends in an extension direction I1 between the first end 11 and the second end 12. The conductor wires 13 are respectively connected to signal terminals that are formed at the first end 11 and the second end 12. The plurality of conductor wires 13 of the extension section 1 comprise at least a power line P1, a primary grounding line Gp1, and a grounding line G1.

The extension section 1 comprises a thin-film printed electronic flat cable, a flexible flat cable (FFC), a flexible printed circuit board (FPC), an electronic cable, a Teflon cable, a coaxial cable, a hybrid cable, or a combined cable of at least two of the above cables.

The first section 2 has an extension connection end 21 and an external connection end 22. The external connection end 22 is provided with a plurality of pairs of differential mode signal transmission terminals S2. Each of the differential mode signal transmission terminals S2 is composed of a first differential mode signal terminal S21 and a second differential mode signal terminal S22. A plurality of grounding terminals G21, G22, G23 are formed on the external connection end 22 of the first section 2. The extension connection end 21 is provided with at least a collective grounding point G2 and a plurality of first differential mode signal terminals S21a and a plurality of second differential mode signal terminals S22a respectively corresponding to the first differential mode signal terminals S21 and the second differential mode signal terminals S22 formed at the external connection end 22. The collective grounding line terminal G2, the first differential mode signal terminals S21a, and the second differential mode signal terminals S22a of the extension connection end 21 are corresponding to and connected with the conductor wires 13 of the first end 11 of the extension section 1.

First conductive lines 23 are formed in the first section 2. The external connection end 21 and the extension connection end 22 of the first section 2 both comprise a power line terminal P2 corresponding to the power line P1 of the extension section 1 and a primary grounding terminal Gp2 corresponding to the primary grounding line Gp1 of the extension section 1. The first section 2 can be a rigid circuit board, a flexible circuit board, or a rigid-flexible board.

At least a first conductive connection line 25 is formed on the first section 2. The first conductive connection line 25 connects the collective grounding point G2 of the extension connection end 21 of the first section 2 to each of the grounding terminals G21, G22, G23 of the external connection end 22. The first conductive connection line 25 comprises one of a silver paste coated line and a conductive through hole.

The second section 3 has an extension connection end 31 and an external connection end 32. The extension connection end 31 is connected to the second end 12 of the extension section 1 and is opposite to the first section 2. The external connection end 32 forms a plurality of pairs of differential mode signal transmission terminals S3. Each of the differential mode signal transmission terminals S3 is composed of a first differential mode signal terminals S31, a second differential mode signal terminals S32. A plurality of grounding terminals G31, G32, G33 are formed on the external connection end 32 of the second section 3. The extension connection end 31 forms at least a collective grounding point G3 and a plurality of first differential mode signal terminals S31a and a plurality of second differential mode signal terminals S32a respectively corresponding to the first differential mode signal terminals S31 and the second differential mode signal terminals S32 formed at the external connection end 32. The collective grounding point G3, the first differential mode signal terminals S31a, and the second differential mode signal terminals S32a of the extension connection end 31 are corresponding to and connected with the conductor wires 13 of the second end 12 of the extension section 1.

Second conductive lines 33 are formed on the second section 3. The external connection end 31 and the extension connection end 32 of the second section 2 both comprise a power line terminal P3 corresponding to the power line P1 of the extension section 1 and a primary grounding terminal Gp3 corresponding to the primary grounding line Gp1 of the extension section 1. The second section 2 can be a rigid circuit board, a flexible circuit board, or a rigid-flexible board.

At least a second conductive connection line 35 is formed on the second section 3. The conductive connection line 25 connects the collective grounding point G3 of the extension connection end 31 of the second section 3 to each of the grounding terminals G31, G32, G33 of the external connection end 32. The second conductive connection line 35 comprises one of a silver paste coated line and a conductive through hole.

Figure 4:
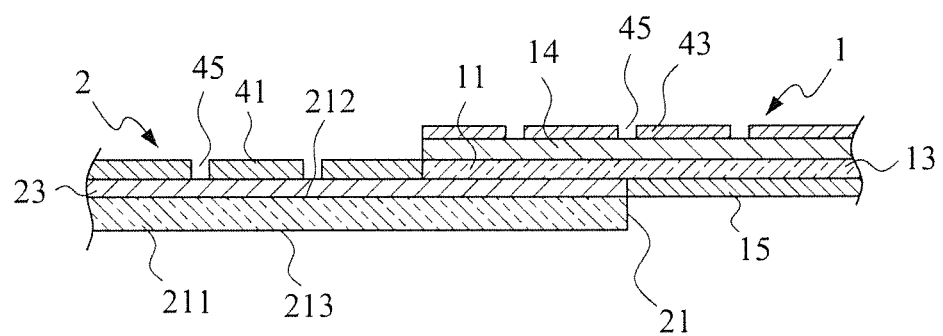
FIG. 4 is schematic cross-sectional view showing an upper surface of the first section is covered by a shielding layer.
Figure 5:
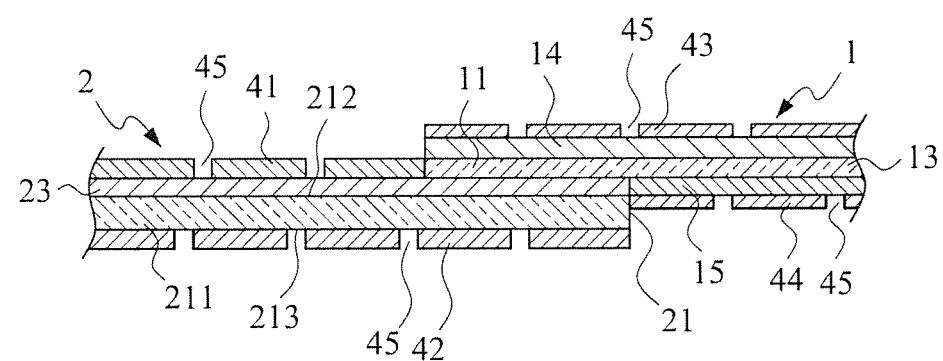
FIG. 5 is a schematic cross-sectional view showing an upper surface and a lower surface of the first section are covered by shielding layers.

Referring to FIGS. 4 and 5, FIG. 4 is schematic cross-sectional view showing an upper surface of the first section is covered by a shielding layer and FIG. 5 is a schematic cross-sectional view showing an upper surface and a lower surface of the first section are covered by shielding layers. As shown in the drawings, the extension section 1 comprises an upper insulation layer 14 and a lower insulation layer 15. The upper insulation layer 14 and the lower insulation layer 15 are respectively formed on an upper surface and a lower surface of the plurality of parallel, straight, and non-jump-connected conductor wires 13. The upper insulation layer 14 and the lower insulation layer 15 can be made of PET or PI insulation material. A shielding layer 43 is selectively formed on the upper insulation layer 14 and a shielding layer 44 is selectively formed on the lower insulation layer 15. The shielding layers 43, 44 may be respectively provided with net-like holed structures 45 for controlling differential mode signal impedance.

Taking the first section 2 as an example for explanation, in considering signal transmission performance and reduction of interference during the transmission of signal, it may need, as desired, to cover an upper shielding layer 41 (see FIG. 4) on the upper surface 212 of the circuit board 211 and the first conductive lines 23. Alternatively, it may cover an upper shielding layer 41 and a lower shielding layer 42 respectively on the upper surface 212 of the circuit board 211 and the first conductive lines 23 and the lower surface 213 of the circuit board. It is apparent that it may need, as desired, to only cover a lower shielding layer 42 on the lower surface 213 of the circuit board 211. The upper shielding layer 41 and the lower shielding layer 42 may be respectively and selectively provided with net-like holed structures 45 for controlling differential mode signal impedance.

Figure 6:
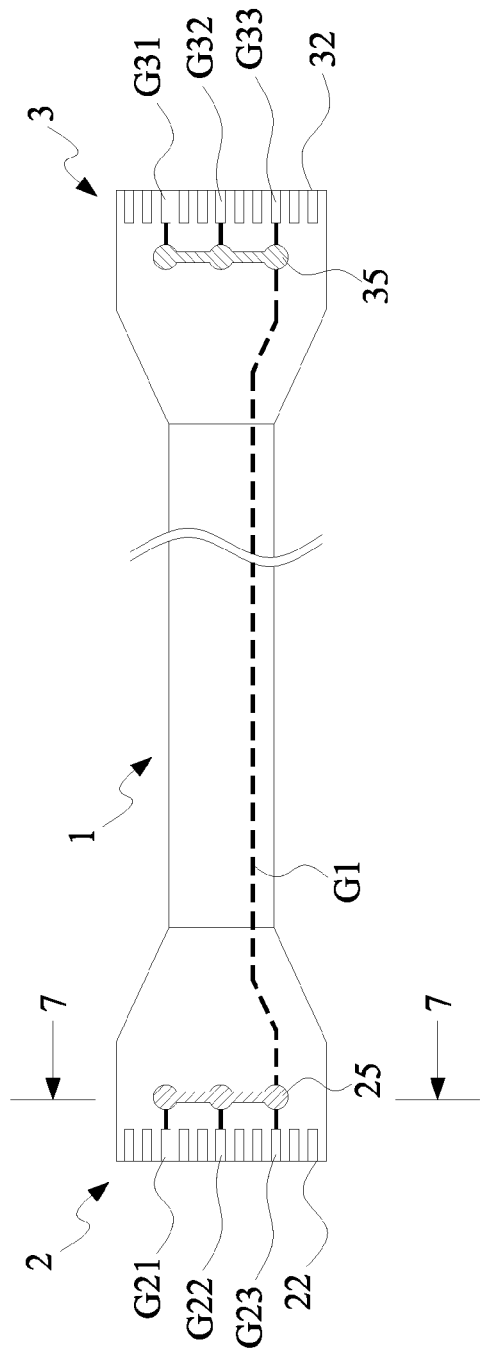
FIG. 6 is a schematic view showing the first embodiment of the present invention.
Figure 7:
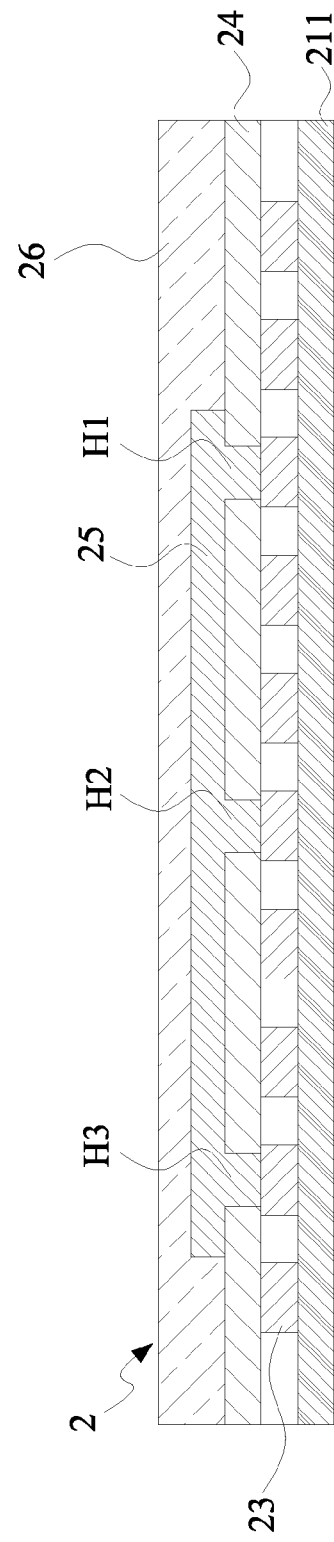
FIG. 7 is a cross-sectional view taken along line 7-7 of FIG. 6.

Referring to FIGS. 6 and 7, FIG. 6 is a schematic view showing the first embodiment of the present invention and FIG. 7 is a cross-sectional view taken along line 7-7 of FIG. 6. The first section 2 and the second section are each formed of a single-sided board. Taking the first section 2 as an example for explanation, the first conductive lines 23 are formed on the circuit board 211. The upper surface of the first conductive lines 23 is covered with an insulation layer 24, the insulation layer 24 forms a holed structure H1 at a location corresponding to the first conductive line 23 connected to the grounding terminal G21, forms a holed structure H2 at a location corresponding to the first conductive line 23 connected to the grounding terminal G22, and also forms a holed structure H3 at a location corresponding to the first conductive line 23 connected to the grounding terminals G23.

In the first embodiment of the present invention, besides the collective grounding line terminal G2, the first differential mode signal terminals S21a and the second differential mode signal terminals S22a of the extension connection end 21 of the first section 2 being respectively connected to the conductor wires 13 of the first end 11 of the extension section 1, the first conductive connection line 25 is provided to electrically connect the first conductive lines 23 that are connected to the grounding terminals G21, G22, G23 so as to provide an effect of grounding. As shown in FIG. 6, the insulation layer 24 is coated with a silver paste coated line to form a first conductive connection line 25 that is electrically connected to the first conductive lines 23 that are connected to the grounding terminals G21, G22, G23 and is then covered by a cover layer 26.

Figure 10:
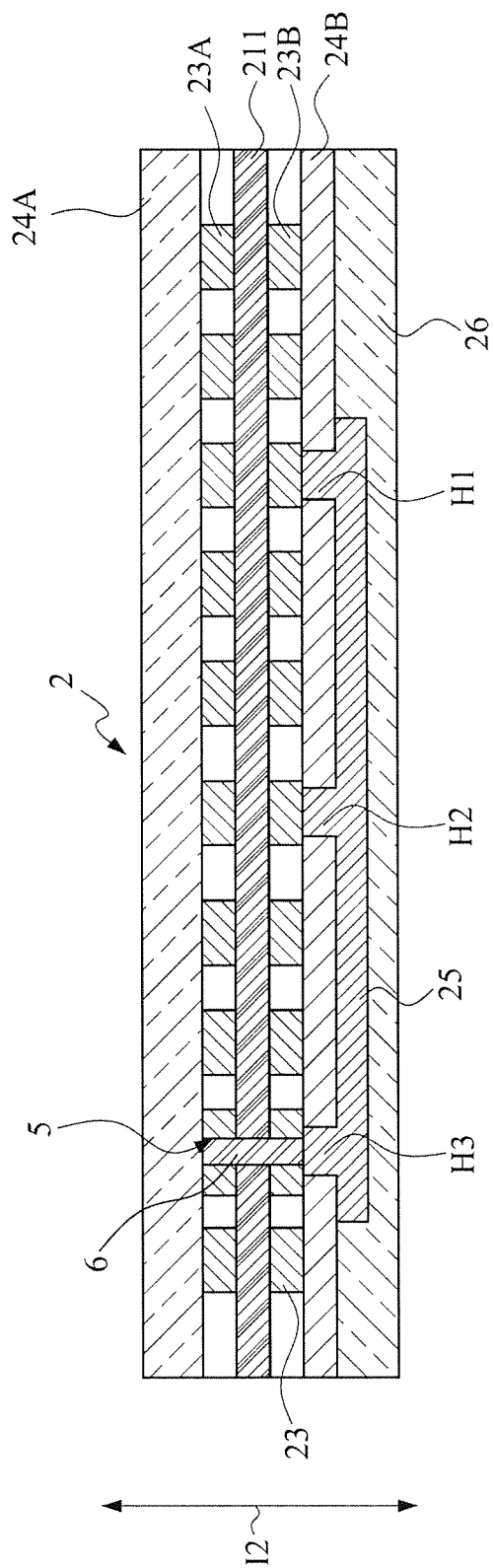
FIG. 10 is a cross-sectional view taken along line 10-10 of FIG. 8 and FIG. 9.

Referring to FIGS. 8-10, FIG. 8 is a top plan view showing a second embodiment of the present invention, FIG. 9 is a schematic view showing a back side of the second embodiment of the present invention, and FIG. 10 is a cross-sectional view taken along line 10-10 of FIG. 8. The first section and the second section are each formed of a double-sided board. Taking the first section 2 as an example for explanation, an upper circuit 23A is formed on an upper surface of the circuit board 211 and an upper insulation layer 24A is formed on a surface of the upper circuit 23A. A lower circuit 23B is formed on a lower surface of the circuit board 211 and a lower insulation layer 24B is formed on a surface of the lower circuit 23B.

The first section 2 comprises at least one conductive through hole 5 extends in a vertical direction 12 through the circuit board 211. The conductive through hole 5 comprises a conductive material 6 deposited therein.

The first conductive line 23 of the upper circuit 23A that is connected to the grounding terminal G21 and the first conductive line 23 of the and the lower circuit 23B that is connected to the grounding terminal G22 are electrically connected to each other through the conductive material 6 of the conductive through hole 5. Thus, the arrangement of the conductive through hole 5 allows it to achieve jump connection and such a jump connection can be used to improve the easiness of circuit connection. The conductive material constituting the conductive material 6 is selected from copper, sliver, gold, or an arbitrary combination thereof.

With the first conductive line 23 of the upper circuit 23A that is connected to the grounding terminal G21 and the first conductive line 23 of the lower circuit 23B that is connected to the grounding terminal G22 being electrically connected to each other through the conductive material 6 of the conductive through hole 5, the lower insulation layer 24B forms a holed structure H1 at a location corresponding to the first conductive line 23 connected to the grounding terminal G21, also forms a holed structure H2 at a location corresponding to the first conductive line 23 connected to the grounding terminal G22, further forms a holed structure H3 at a location corresponding to the first conductive line 23 connected to the grounding terminal G23, and arranges the first conductive connection line 25 to electrically connect with the first conductive lines 23 that are connected to the grounding terminals G21, G22, G23.

Figure 11:
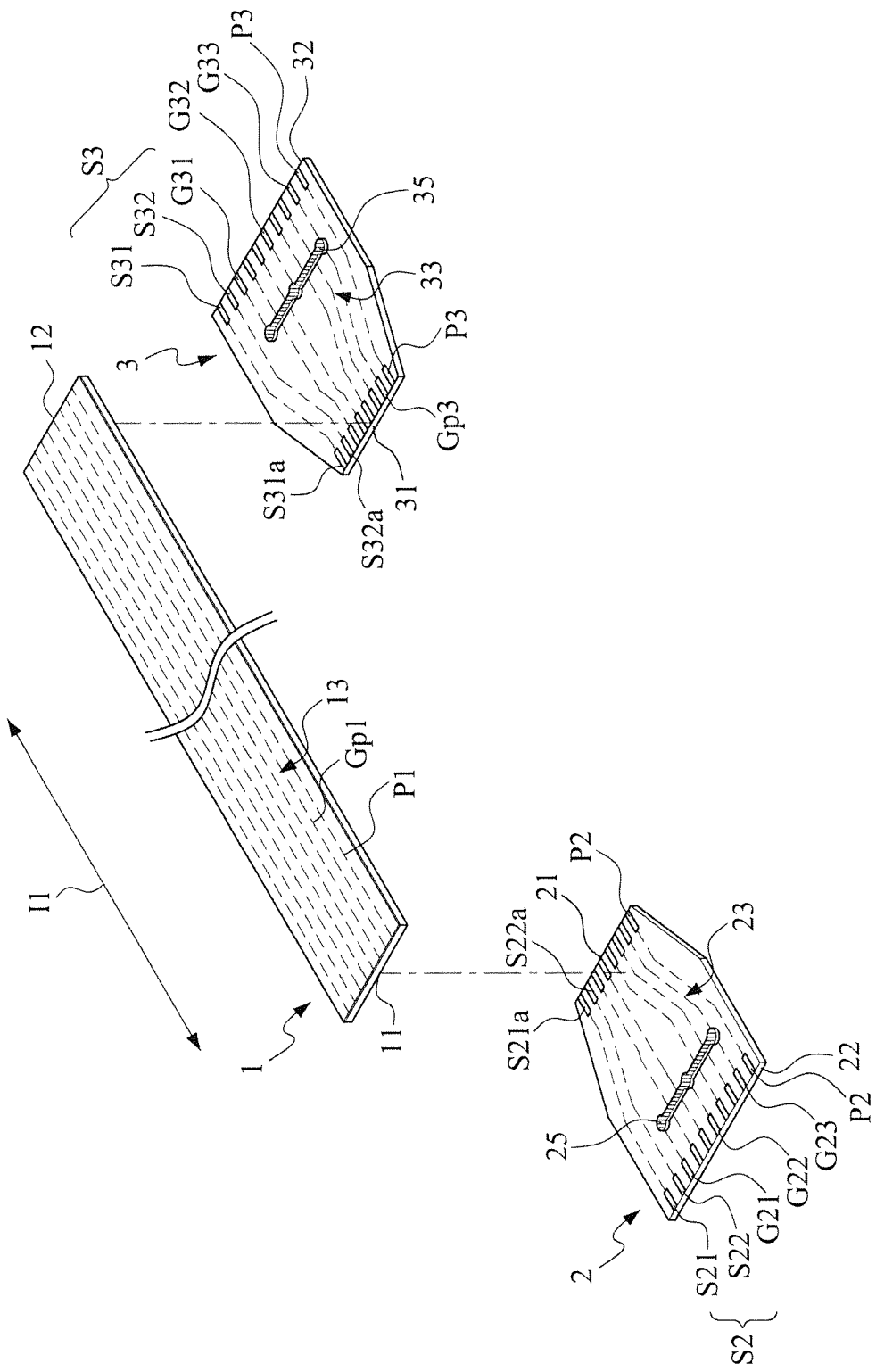
FIG. 11 is an exploded view showing a third embodiment of the present invention.

In the embodiment shown in FIG. 2, the plurality of conductor wires 13 of the extension section 1 comprise the grounding line G1; the extension connection end 21 of the first section 2 comprises the collective grounding point G2; and the extension connection end 31 of the second section 3 comprises the collective grounding point G3. However, in a third embodiment of the present invention (see FIG. 11), arrangements may be made such that the plurality of conductor wires 13 of the extension section 1 comprises no grounding line G1, the extension connection end 21 of the first section 2 comprises no collective grounding point G2, and the extension connection end 31 of the second section 3 comprises no collective grounding point G3, while each of the grounding terminals G21, G22, G23 of the first section 2 is connected by the first conductive connection line 25 to any collective grounding point of an electronic device or can be grounded via the primary grounding terminal Gp2. Similarly, each of the grounding terminals G31, G23, G33 of the second section 3 is connected by the second conductive connection line 35 to any collective grounding point of an electronic device or can be grounded via the primary grounding terminal Gp3. This allows further reduction of the number of the extension section 1.

Figure 12:
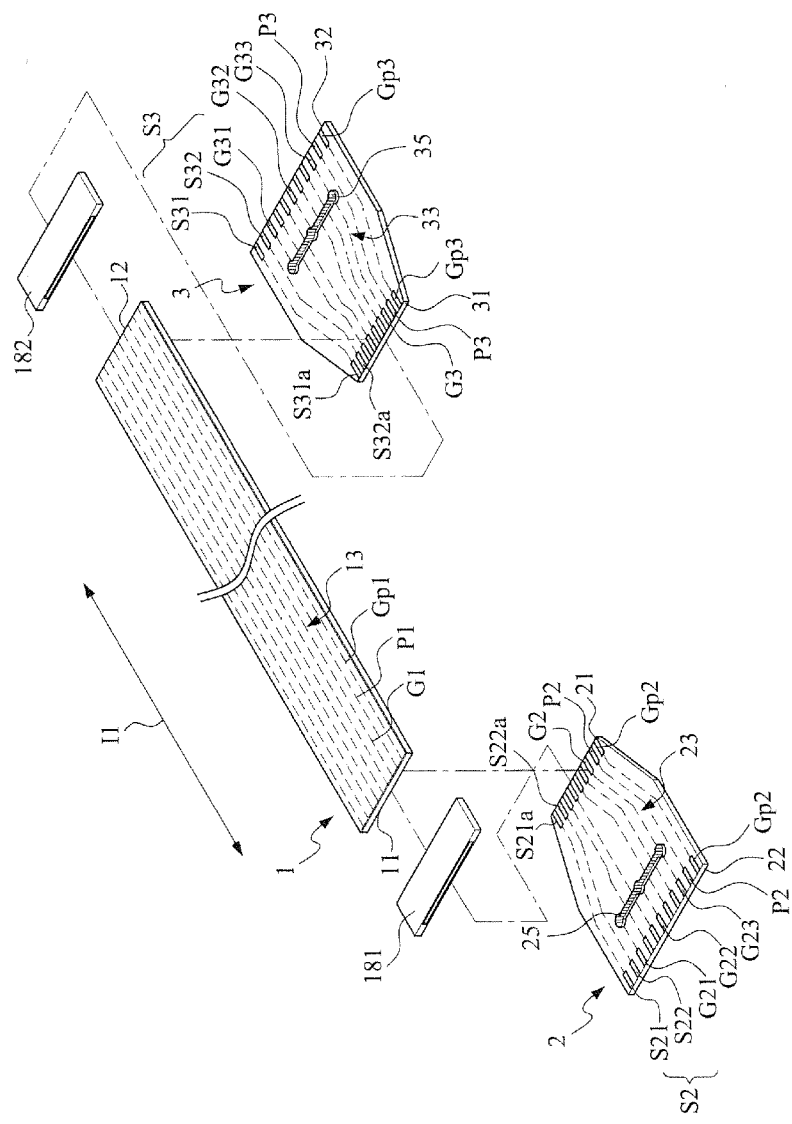
FIG. 12 is an exploded view showing a fourth embodiment of the present invention.

The extension connection end 21 of the first section 2 can be connected by soldering to the first end 11 of the extension section 1 and the extension connection end 31 of the second section 3 can also be connected by soldering to the second end 12 of the extension section 1. It is apparent that the connection can be done with other suitable means. For example, in a fourth embodiment of the present invention shown in FIG. 12, the extension connection end 21 of the first section 2 and the first end 11 of the extension section 1 are connectable to each other through insertion into a connector 181. The extension connection end 31 of the second section 3 and the second end 12 of the extension section 1 are also connectable to each other through insertion into another connector 182.

Figure 13:
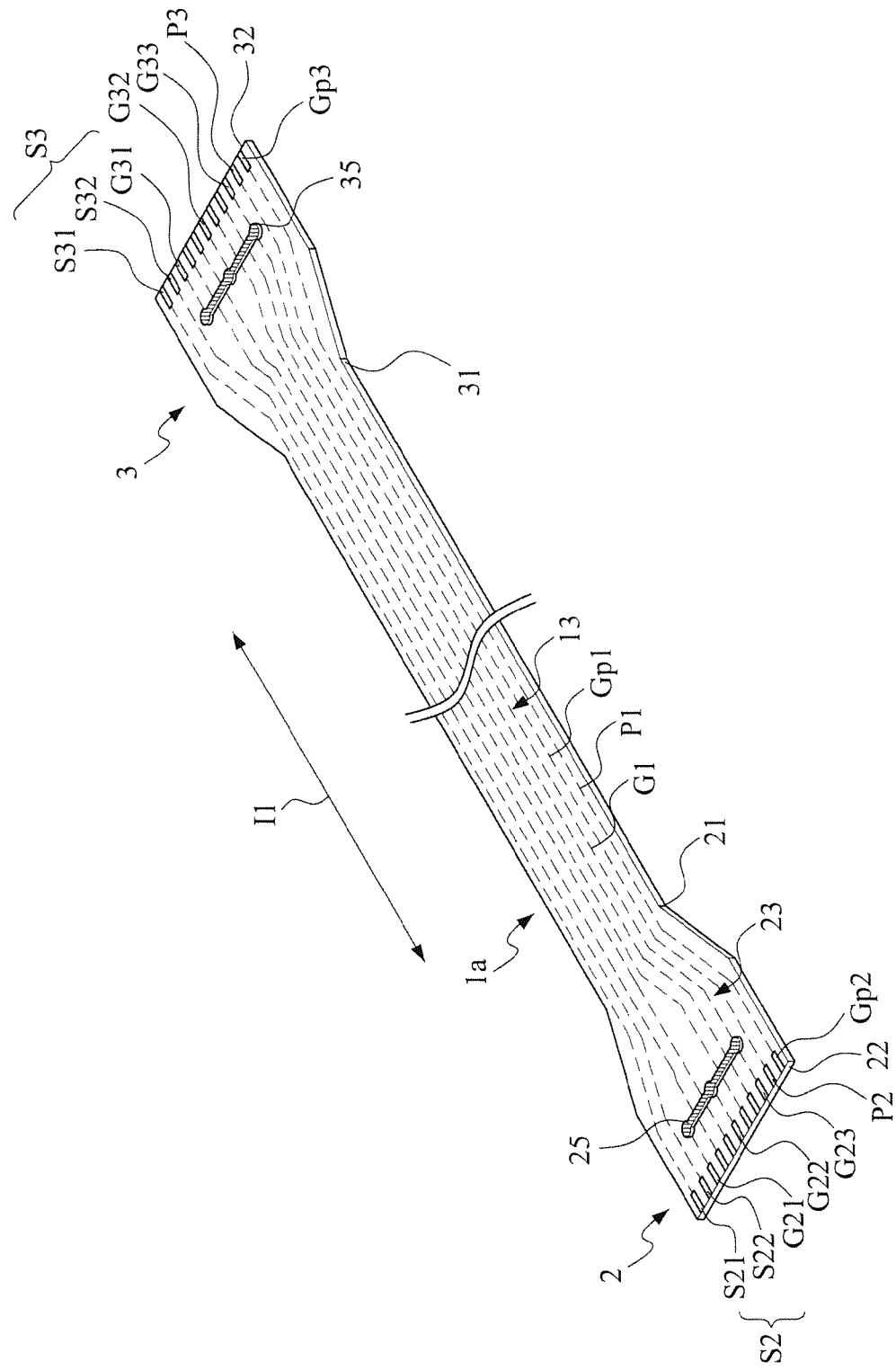
FIG. 13 is an exploded view showing a fifth embodiment of the present invention.

Referring to FIG. 13, it is shown that in a fifth embodiment of the present invention, the extension connection end 21 of the first section 2 is integrally extended and connected through an extension section 1a formed of the same material to the extension connection end 31 of the second section 3. In this integrally-formed embodiment, the extension section 1a may comprise a grounding line or may not comprise a grounding line.

Figure 14:
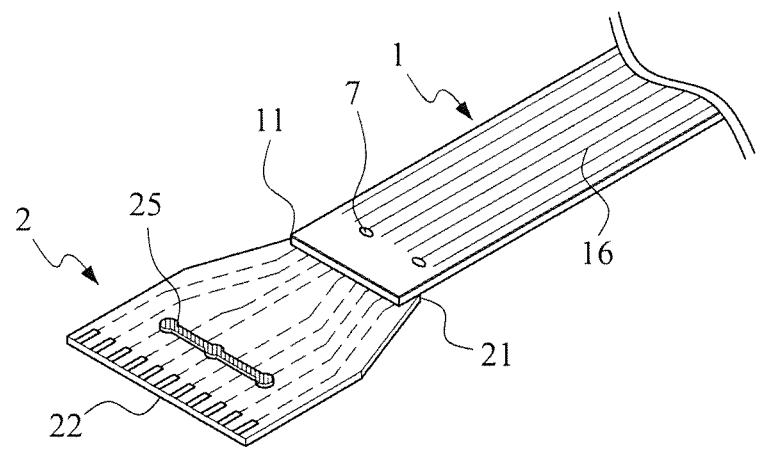
FIG. 14 is a schematic view showing the extension section is further slit to form a plurality of slit lines.
Figure 15:
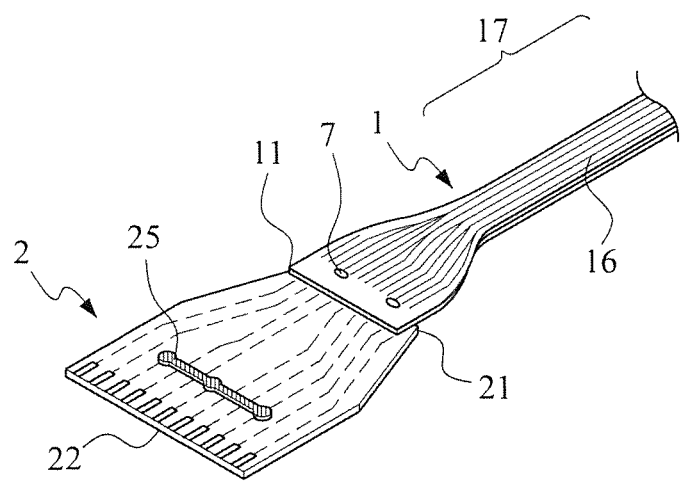
FIG. 15 is a schematic view showing the extension section is folded after being slit.
Figure 16:
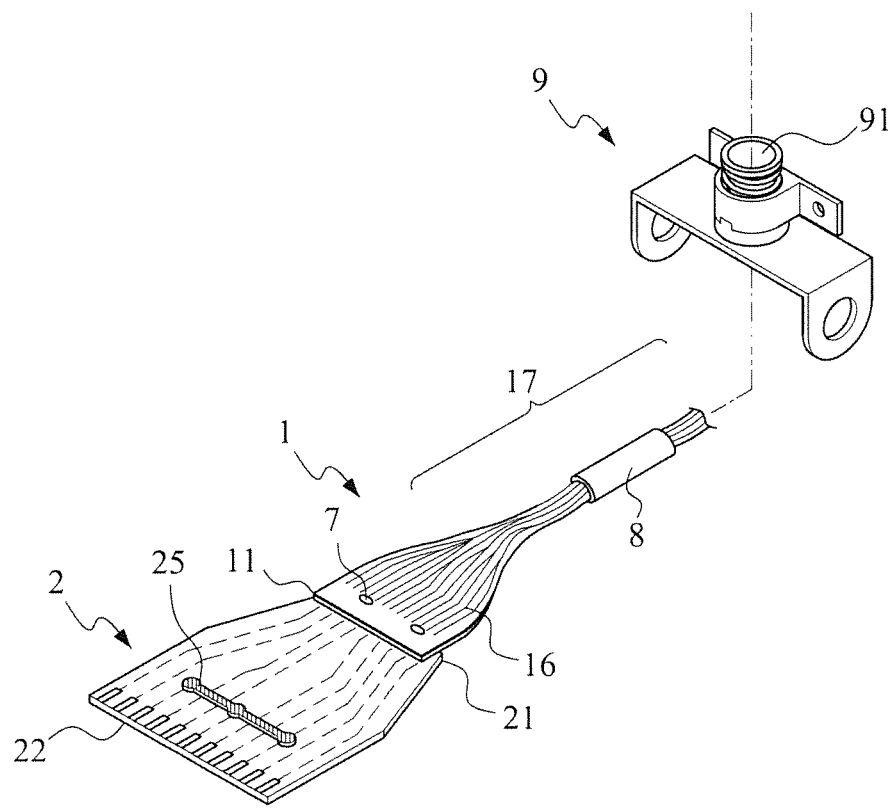
FIG. 16 is a schematic view showing the extension section is wrapped after being slit.

Referring to FIGS. 14-16, FIG. 14 is a schematic view showing the extension section is slit to form a plurality of slit lines, FIG. 15 is a schematic view showing the extension section is folded after being slit, and FIG. 16 is a schematic view showing the extension section is wrapped after being slit. The extension section 1 can be slit along gaps between and parallel to conductor wires 13 to form a plurality of slit lines 16 that separates the plurality of conductor wires into a plurality of conductor wire units. At least one tear protection hole 7 is formed at one end of the slit lines 16. The tear protection hole 7 functions to prevent tearing apart of the extension section.

The extension section 1 comprises at least one bundled section 17 (see FIG. 15) and a wrapping member 8 is used to wrap around the bundled section 17 (see FIG. 16) to reduce surface area of the extension section. This improves design flexibility of the circuit board and also helps extension through a bore 91 of a hinge member 9 or a narrow hole (not shown).

Figure 17:
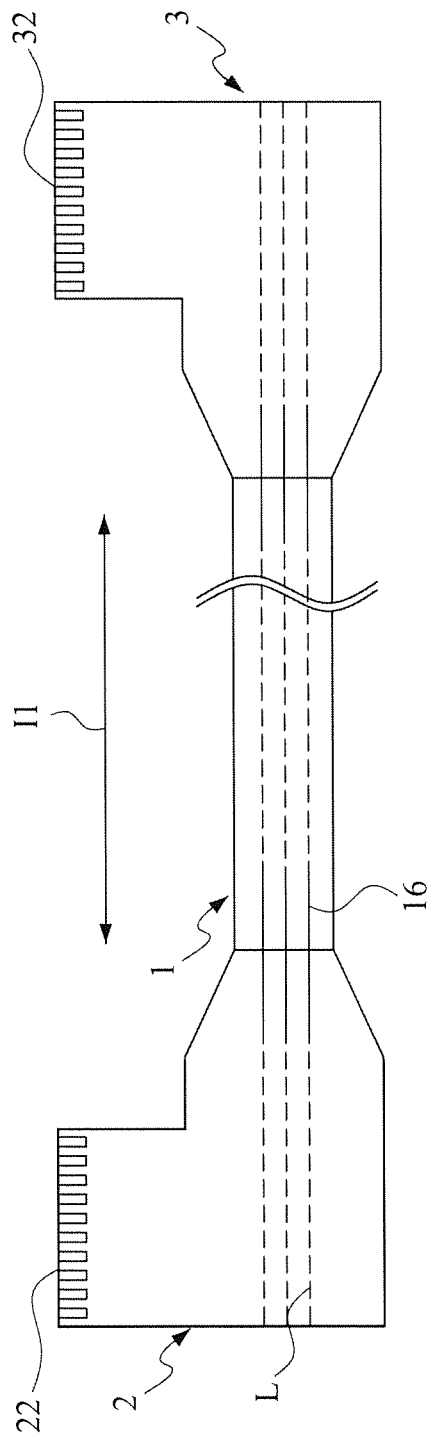
FIG. 17 is a schematic view showing a sixth embodiment of the present invention.
Figure 18:
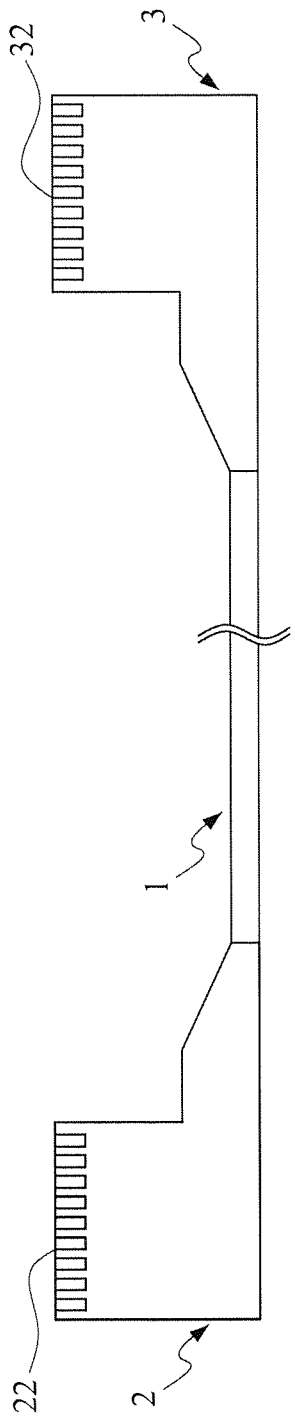
FIG. 18 is a schematic view showing the sixth embodiment of the present invention after being folded.

Referring to FIGS. 17 and 18, FIG. 17 is a schematic view showing a sixth embodiment of the present invention and FIG. 18 is a schematic view showing the sixth embodiment of the present invention after being folded. The first section 2 has an extension connection end 21 and an external connection end 22 that are oriented in perpendicular directions. The second section 3 has an extension connection end 31 and an external connection end 32 that are oriented in perpendicular directions.

At least one fold line L is formed to extend along the extension direction I1 of the extension section 1 through the extension section 1, the first section 2, and the second section 3. At least one slit line 16 extending parallel to the fold line L is formed in the interface between the extension section 1 and the first section 2 and between the extension section and the second section 3. The fold line L and the slit lines 16 allow the extension section 1, the first section 2, and the second section 3 of the second embodiment of the present invention to be folded to show a size-reduced structure (see FIG. 18), whereby in a circuit application, the amount of space of the circuit occupied by the extension section can be reduced. Further, it also helps the extension section to extend through a narrow hole or a bore of a hinge member.

In summary, the present invention provides a differential mode signal transmission module, which comprises an extension section, a first section, and a second section. The extension section can be a standard flexible circuit cable or flat cable available in the market or an integrally formed extension section. The first section and the second section can each be a rigid circuit board, a flexible circuit board, or a rigid-flexible board.

The present invention provides the following advantages:

(1) A flexible circuit cable is used for connection of differential mode signals. Compared to the solution of transmitting signals with a flexible circuit board, the present invention can reduce the manufacturing cost of electronic devices.

(2) The present invention arranges a shielding layer on an upper surface and/or a lower surface of the first section and/or the second section to provide improved functions of electromagnetic shielding and electrostatic discharge elimination.

(3) The present invention provides a combined flat cable structure formed of a bundled flexible circuit cable and circuit boards to serve as cable extension through a hinge portion of electronic device.

(4) The present invention provides connection arrangement achieved with conductive connection line, wherein the conductive connection line is formed of a silver paste coated line or a conductive through hole provided on the first section or the second section for electrical connection established for specific lines thereby improving utilization of electrical connection and reducing the number of conductor wires included in a flexible circuit cable, and thus reducing the manufacturing cost of electronic device.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A differential mode signal transmission module for transmitting a differential mode signal, comprising:
    a first section having an external connection end and an extension connection end, wherein:
        the external connection end having plurality of differential mode signal transmission terminals, each of the differential mode signal transmission terminals having a grounding terminal, a first differential mode signal terminal, and a second differential mode signal terminal;
        the extension connection end having a corresponding plurality of counterpart differential mode signal transmission terminals, each counterpart terminal having corresponding first and second differential mode signal terminals, the extension connection end further having a certain number of collective grounding points;
    at least one first conductive connection line formed on a surface of the first section, the at least one first conductive connection line connecting at least a portion of the plurality of grounding terminals from the external connection end of the first section to at least one of the certain number of the collective grounding points formed at the extension connection end of the first section, the certain number of collective grounding points being fewer than a total number of the differential mode signal transmission terminals at the external connection end of the first section;
    an extension section having a first end coupled to the extension connection end of the first section and an opposing second end, and a plurality of parallel conductor wires extending in an extension direction between corresponding first signal terminals at the first end and second signal terminals at the second end, the first signal terminals being connected to corresponding said first differential mode signal terminals, said second differential mode signal terminals, and said collective grounding points of the extension connection end of the first section; and
    a second section coupled to the second end of the extension section, the second section having an external connection end and an extension connection end, wherein:
        the extension connection end of the second section having a plurality of counterpart differential mode signal transmission terminals corresponding to the counterpart differential mode signal transmission terminals of the extension connection end of the first section, each terminal having corresponding first and second differential mode signal terminals, the extension connection end of the second section further having a number of collective grounding points equal to the certain number of collective grounding points of the extension connection end of the first section, wherein the second signal terminals of the extension section are connected to corresponding said first differential mode signal terminals, said second differential mode signal terminals, and said collective grounding points formed on the extension connection end of the second section;
        the external connection end of the second section having a plurality of differential mode signal transmission terminals corresponding to the plurality of differential mode signal transmission terminals of the external connection end of the first section, each of the differential mode signal transmission terminals of the external connection end of the second section having a grounding terminal, a first differential mode signal terminal, and a second differential mode signal terminal;
    at least one second conductive connection line formed on a surface of the second section, the at least one second conductive connection line connecting at least one of the collective grounding points formed at the extension connection end of the second section to at least a portion of the plurality of grounding terminals in the external connection end of the second section, the number of collective grounding points being fewer than a total number of the differential mode signal transmission terminals at the external connection end of the second section.

2. The differential mode signal transmission module as claimed in claim 1, wherein the external connection end and the extension connection end of the first section each comprise at least one power line terminal and at least one primary grounding terminal.

3. The differential mode signal transmission module as claimed in claim 1, wherein the external connection end of the first section comprises one of an insertion terminal, an insertion socket, a connector, a soldered terminal, an electronic component, and a surface-mounted component.

4. The differential mode signal transmission module as claimed in claim 1, wherein the first section comprises one of a rigid circuit board, a flexible circuit board, and a rigid-flexible board.

5. The differential mode signal transmission module as claimed in claim 1, wherein the first section has an upper surface and a lower surface one of which comprises a shielding layer.

6. The differential mode signal transmission module as claimed in claim 5, wherein the shielding layer comprises a net-like holed structure for impedance control of the differential mode signal impedance.

7. The differential mode signal transmission module as claimed in claim 1, wherein the plurality of parallel conductor wires extending in the extension direction are straight, and non-jump-connected conductor wires.

8. The differential mode signal transmission module as claimed in claim 1, wherein the extension connection end of the first section is coupled to the first end of the extension section by one of soldering and a connector.

9. The differential mode signal transmission module as claimed in claim 1, wherein the second conductive connection line comprises one of a silver paste coated line and a conductive through hole.

10. The differential mode signal transmission module as claimed in claim 1, wherein the external connection end and the extension connection end of the second section each comprise at least one power line terminal and at least one primary grounding terminal.

11. The differential mode signal transmission module as claimed in claim 1, wherein the external connection end of the second section comprises one of an insertion terminal, an insertion socket, a connector, a soldered terminal, an electronic component, and a surface-mounted component.

12. The differential mode signal transmission module as claimed in claim 1, wherein the second section comprises one of a rigid circuit board, a flexible circuit board, and a rigid-flexible board.

13. The differential mode signal transmission module as claimed in claim 1, wherein the second section has an upper surface and a lower surface one of which comprises a shielding layer.

14. The differential mode signal transmission module as claimed in claim 13, wherein the shielding layer comprises a net-like holed structure for controlling differential mode signal impedance.

15. The differential mode signal transmission module as claimed in claim 1, wherein the extension section comprises at least one slit line extending in an extension direction.

16. The differential mode signal transmission module as claimed in claim 15, wherein the extension section is receivable through one of a bore of a hinge member and a narrow hole.

17. The differential mode signal transmission module as claimed in claim 1, wherein the extension section comprises at least one bundled section.

18. The differential mode signal transmission module as claimed in claim 17, wherein the bundled section comprises a wrapping member wrapping around the bundled section.

19. The differential mode signal transmission module as claimed in claim 1, wherein the first conductive connection line comprises one of a silver paste coated line.

20. The differential mode signal transmission module as claimed in claim 1, wherein the first section, the second section, and the extension section comprise at least one fold line extending in an extension direction to allow the first section and the extension section to fold along the fold line.

21. The differential mode signal transmission module as claimed in claim 20, wherein the first section, the second section, and the extension section are foldable along the fold line with a wrapping member wrapping the extension section.

* * * * *